United States Patent
Beck

(10) Patent No.: US 11,067,653 B2
(45) Date of Patent: Jul. 20, 2021

(54) MAGNETIC RESONANCE IMAGING METHOD INCLUDING ACQUIRING ECHO SIGNALS FROM EACH K-SPACE SLICE WITH DIFFERENT RELAXATION TIME WEIGHTINGS AFTER ECHO SIGNALS FROM DIFFERENT K-SPACE SPLICES ARE ACQUIRED

(71) Applicant: KONINKLIJKE PHILIPS N.V., Eindhoven (NL)

(72) Inventor: Gabriele Marianne Beck, Venlo (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/619,539

(22) PCT Filed: Jun. 4, 2018

(86) PCT No.: PCT/EP2018/064542
§ 371 (c)(1),
(2) Date: Dec. 5, 2019

(87) PCT Pub. No.: WO2018/224411
PCT Pub. Date: Dec. 13, 2018

(65) Prior Publication Data
US 2020/0150206 A1    May 14, 2020

(30) Foreign Application Priority Data
Jun. 9, 2017   (EP) ..................................... 17175142

(51) Int. Cl.
*G01R 33/48*    (2006.01)
*G01R 33/50*    (2006.01)
(Continued)

(52) U.S. Cl.
CPC ..... *G01R 33/4826* (2013.01); *G01R 33/4828* (2013.01); *G01R 33/50* (2013.01);
(Continued)

(58) Field of Classification Search
CPC ............ G01R 33/4818; G01R 33/4824; G01R 33/4828; G01R 33/50; G01R 33/5602;
(Continued)

(56) References Cited

U.S. PATENT DOCUMENTS 8,878,535 B2   11/2014  Gulaka et al.
9,921,285 B2    3/2018  Otazo et al.
(Continued)

FOREIGN PATENT DOCUMENTS

WO   WO-2016202707 A1 * 12/2016  ......... G01R 33/5611

OTHER PUBLICATIONS

Neumann et al "Reducing Contrast Contamination in Radial Turbo-Spin Echo Acquisitions by Combining a Narrow Band KWIC Filter with Parallel Imaging" Magn. Reson. Med p. 1680-1686 Jan. 16, 2014.
(Continued)

*Primary Examiner* — Jay Patidar

(57) ABSTRACT

The invention relates to a method of MR imaging of an object. It is an object of the invention to enable MR imaging using the stack-of-stars acquisition scheme with an enhanced control of the contrast of the reconstructed MR image. The method of the invention comprises the steps of: a) generating MR signals by subjecting the object (10) to a number of shots of a multi-echo imaging sequence comprising RF pulses and switched magnetic field gradients, wherein a train of echo signals is generated by each shot; b) acquiring the echo signals according to a stack-of-stars (i.e. a hybrid radial 3D acquisition scheme wherein radial sampling is performed in each slice plane and phase encoding is
(Continued)

performed along the slice encoding direction) or stack-of-spirals scheme, wherein the echo signals are acquired as radial or spiral k-space profiles (S1-S12) arranged at different positions along a slice direction in k-space, wherein echo signals from different k-space slices are acquired in each shot of the imaging sequence and wherein the echo signals are acquired from each k-space slice with different relaxation time weightings; and c) reconstructing at least one MR image of a desired contrast from the acquired echo signals using a k-space weighted image contrast (KWIC) filter. Moreover, the invention relates to a MR device (1) and to a computer program for a MR device (1).

16 Claims, 2 Drawing Sheets

(51) Int. Cl.
*G01R 33/56* (2006.01)
*G01R 33/561* (2006.01)
(52) U.S. Cl.
CPC ..... *G01R 33/5602* (2013.01); *G01R 33/5608* (2013.01); *G01R 33/5615* (2013.01)
(58) Field of Classification Search
CPC ............ G01R 33/5611; G01R 33/5613; G01R 33/5615; G01R 33/4826; G01R 33/5608; G06T 11/006; G06T 2210/41
See application file for complete search history.

(56) References Cited

U.S. PATENT DOCUMENTS

| | | | |
|---|---|---|---|
| 2014/0043024 A1* | 2/2014 | Gui ................... | G01R 33/4824 324/309 |
| 2014/0292330 A1 | 10/2014 | Gulani et al. | |
| 2015/0327783 A1 | 11/2015 | Wang | |
| 2016/0266223 A1 | 9/2016 | Bi et al. | |
| 2016/0274201 A1 | 9/2016 | Zhu et al. | |
| 2016/0274209 A1* | 9/2016 | Dannels .............. | G01R 33/4824 |
| 2016/0334488 A1 | 11/2016 | Bieri et al. | |
| 2018/0149721 A1 | 5/2018 | Beck | |

OTHER PUBLICATIONS

Gmitro et al "Radial GRASE:Implementation and Applications" Magnetic Reson. in Med. vol. 53, No. 6, p. 1363-1371 (2005).
Svedin et al "In Vivo Evaluation of a Multi-Echo Pseudo-Golden Angle Stack of Stars Thermometry Method" Proceedings of the International Society for Magnetic Reson. in Med. p. 5423 (2017).
Search Report from PCT/EP2018/064542 dated Aug. 1, 2018.
Keerthivasan et al "High Resolution 3D T2 Mapping Using a Stack of Stars Radial FSE Pulse Sequence" Proceedings of the International Society for Magnetic Res. in Med. p. 3957 (2017).
Armstrong "Free Breathing Fat Quantification in the Liver Using a Multiecho 3D Stack of Radial Technique . . . " Proceedings of the International Society for Magnetic Resonance in Med. p. 363 2017.
Benjamin Paul Berman et al.,"How to stack the stars: a variable center-dense k-space trajectory for 3D MRI" Apr. 23, 2013.
Zhitao Li et al., "Highly Accelerated 3D Dynamic Imaging with Variable Density Golden Angle Stack-of-Stars Sampling" Proc. Intl. Soc. Mag. Reson. Med 21 p. 3797 (2013).
Hee Kwon Song et al., Noncontrast Enhanced Four-Dimensional Dynamic MRA with Golden Angle Radial Acquisition and K-space Weighted Image Contrast (KWIC) Reconstruction; Mag. Reson. in Med. 72 p. 1541-1551 (2014).
Li Feng et al., Golden-Angle Radial Sparse Parallel MRI: Combination of Compressed Sensing, Parallel Imaging, and Golden-Angle Radial Sampling for Fast and Flexible Dynamic Volumetric MRI; Magnetic Resonance in Med. vol. 72. p. 707-717 (2014).
Li Feng et al., "XD-GRASP: Golden-Angle Radial MRI with Reconstruction of Extra Motion-State Dimensions Using Compressed Sensing" Magnetic Resonance in Med. 75 p. 775-788 (2016).
Song HK et. al, "k-Space Weighted Image Contrast Manipulation in Project Reconstruction MRI" Magn Reson Med. Dec. 2000;44(6):825-32.

* cited by examiner

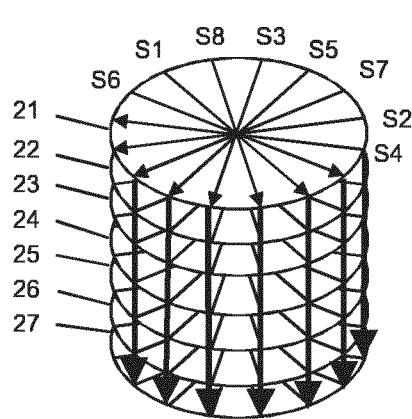
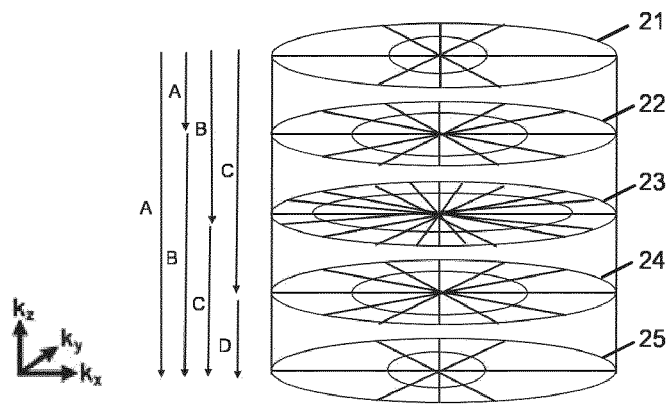
Fig. 2　　　　　　　　　　　Fig. 3
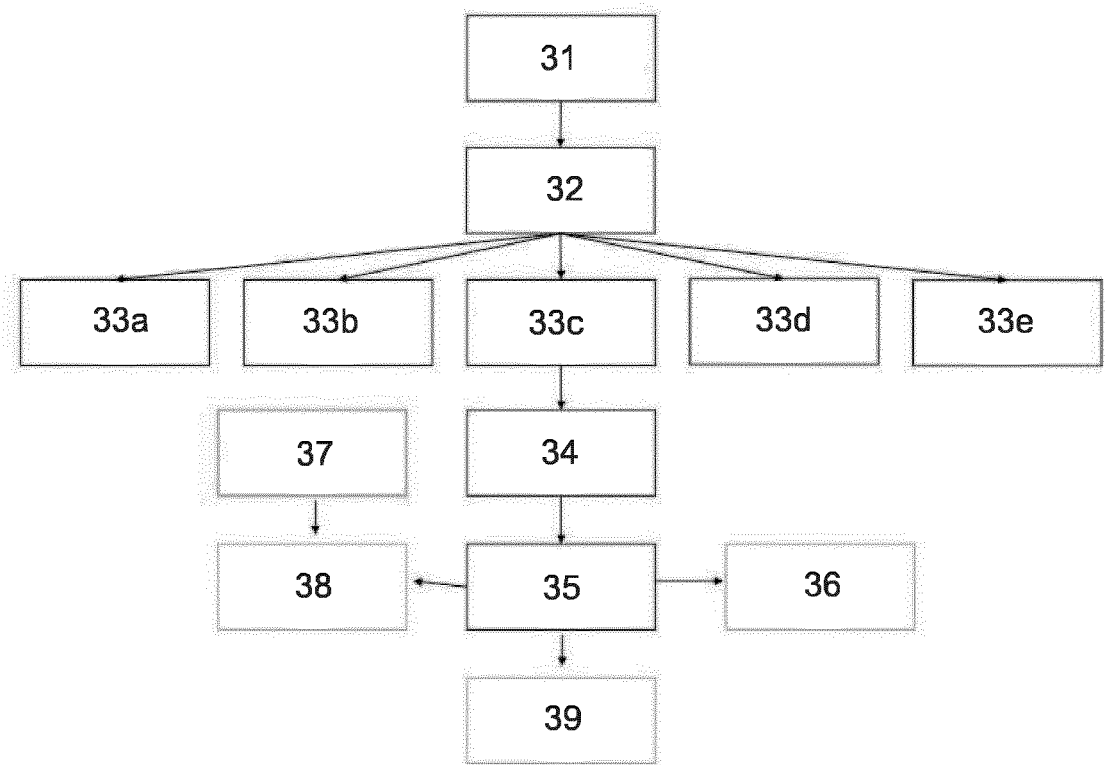
Fig. 4

MAGNETIC RESONANCE IMAGING METHOD INCLUDING ACQUIRING ECHO SIGNALS FROM EACH K-SPACE SLICE WITH DIFFERENT RELAXATION TIME WEIGHTINGS AFTER ECHO SIGNALS FROM DIFFERENT K-SPACE SPLICES ARE ACQUIRED

CROSS REFERENCE TO RELATED APPLICATIONS

This application is a U.S. national phase application of International Application No. PCT/EP2018/064542 filed on Jun. 4, 2018, which claims the benefit of EP Application Serial No. 17175142.3 filed on Jun. 9, 2017 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

In the known so-called three-dimensional (3D) stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel slices. The slices are arranged at different positions along a slice direction in k-space. In the slice direction (e.g. the $k_z$-direction) standard Cartesian phase-encoding is performed, while the MR signals are acquired within each single slice along radial 'spokes' that are rotated around the center ($k_x=k_y=0$). This results in a cylindrical k-space coverage composed of stacked discs ('stack-of-stars'). Technically, this is realized by generating magnetic field gradients in the in-plane directions of the slices simultaneously and modulating their amplitudes. Different schemes can be used for selecting the temporal order of the k-space profile acquisition steps. E.g., all phase-encoding steps along the slice direction can be acquired sequentially before k-space profiles at different angular positions are acquired. This ensures that periods of Cartesian sampling are kept short, which leads to high data consistency within the stack of slices and preserves the general motion-robustness of radial sampling for the stack-of-stars approach. The Cartesian phase-encoding steps may be performed from the center slice to the k-space periphery (centric out), or in linear order from $-k_{z,max}$ to $+k_{z,max}$. For the angular ordering, the imaging sequence can use either equidistant angular sampling with multiple interleaves or the so-called Golden angle-scheme. In the equidistant scheme, the angular distance is calculated according to $\Delta\Phi=180°/n_{total}$ where $n_{total}$ is the total number of spokes. It may be beneficial to acquire the spokes using multiple interleaves (or 'rotations') because the interleaving reduces temporal coherences in k-space. Thus, motion inconsistencies are spread out in k-space and artifacts are attenuated. In the Golden angle-scheme, the angle of the k-space profile is incremented each time by $\Delta\Phi=111.25°$, which corresponds to 180° multiplied by the Golden ratio. Therefore, subsequently sampled spokes always add complementary information while filling the largest gaps within the previously sampled set of spokes. As a consequence, any sequential set of acquired spokes covers k-space approximately uniformly, which, e.g., enables reconstruction of temporal sub-frames and makes the Golden-angle scheme well-suited for dynamic imaging studies.

Similarly, in the also known stack-of-spirals acquisition scheme, each non-selective or slab-selective RF excitation is followed by the acquisition of one or more MR signals that represent spiral k-space profiles. Like in the stack-of-stars method, the slices are also arranged at different positions along a slice direction in k-space, wherein standard Cartesian phase-encoding is performed in the slice direction, while the MR signals are acquired within each single slice along spiral trajectories having their origin in the k-space center ($k_x=k_y=0$).

The afore-described 3D radial stack-of-stars and stack-of-spirals schemes offer several promising advantages for clinical MR imaging like high motion-robustness, benign aliasing artifacts and a continuous updating of k-space center.

3D radial stack-of-stars and stack of spirals imaging provide opportunities from intrinsic oversampling of central k-space.

However, signal modulations, especially with the use of long echo trains as, for example, typical in turbo spin echo imaging, lead to contrast contamination not providing the contrast that radiologists typically require.

SUMMARY OF THE INVENTION

From the foregoing it is readily appreciated that there is a high diagnostic need for an improved technique that addresses contrast contamination with the use of long echo trains. It is consequently an object of the invention to enable MR imaging using the stack-of-stars or stack-of-spirals acquisition scheme with an enhanced control of the contrast of the reconstructed MR images.

In accordance with the invention, a method of MR imaging of a body of an object placed in the examination volume of a MR device is disclosed. The method comprises the steps of:
a) generating MR signals by subjecting the object to a number of shots of a multi-echo imaging sequence comprising RF pulses and switched magnetic field gradients, wherein a train of echo signals is generated by each shot;
b) acquiring the echo signals according to a stack-of-stars or stack-of-spirals scheme, wherein the echo signals are acquired as radial or spiral k-space profiles (S1-S12) arranged at different positions along a slice direction in k-space, wherein echo signals from different k-space slices are acquired in each shot of the imaging sequence and wherein the echo signals are acquired from each k-space slice with different relaxation time weightings; and
c) reconstructing at least one MR image of a desired contrast from the acquired echo signals using a k-space weighted image contrast filter.

According to the invention, echo signals from different k-space slices are acquired in each shot, for example by means of a multi-echo imaging technique in which a train of echo signals differently phase-encoded in the (Cartesian) slice direction is generated. The relaxation time weightings of the echo signals are varied during acquisition of the full signal data set such that the echo signals attributed to each given k-space slice are acquired with different relaxation time weightings. The variation of the TSE contrast per k-space slice is achieved in this embodiment by starting the acquisition in a different slice in each shot. In this way, a collection of echo signals having different contrasts can be acquired from the center of k-space during a full acquisition. The k-space slices are sampled by a number of differently phase-encoded radial or spiral k-space profiles such that the known k-space weighted image contrast (KWIC) filtering technique can be employed to reconstruct a MR image of desired relaxation-time weighting by appropriately filtering the k-space data on which the image reconstruction is based (see Song et al., Magn. Reson. Med., 44, 825-832, 2000). The KWIC technique employed according to the invention exploits the inherent substantial oversampling by the radial or spiral scanning of the center of k-space which contains the crucial information regarding image contrast. Hence, by appropriate filtering of the k-space data, the invention enables the reconstruction of an individual relaxation time weighted MR image for each relaxation time weighting applied during acquisition. Contaminations from unwanted relaxation time weightings can be strongly reduced corresponding to the desired image contrast.

The relaxation time weightings of the echo signals may be varied by variation of echo times of the imaging sequence. The relaxation time weighting may further be varied by varying the delay (e.g. inversion) time after an (inversion recovery) pre-pulse.

For estimation of the relaxation time weighting of the echo signals, corresponding relaxation time maps such as, e.g., (quantitative) $T_2$-maps may be derived from the acquired echo signals which allows to compensate the acquired echo signals for variations according to the derived respective maps. In this way, a 'de-blurred' MR image can be reconstructed from the thus compensated echo signals (see Neumann et al., Magn. Reson. Med., 1680-1686).

In order to achieve a fast acquisition of the signal data, the imaging sequence employed by the method of the invention may be, for example, a turbo spin echo (TSE) sequence or a turbo field echo (TFE) sequence or a balanced (turbo) field echo sequence or an echo planar imaging (EPI) or GRASE sequence. The relaxation time weighting may be varied by variation of the acquisition order of the k-space lines from shot to shot. The $T_2$-weighting of a k-space profile at a given position in the stack of slices in k-space depends on the position of the corresponding echo signal in the train of echo signals. The relaxation time weighting can thus be easily varied by changing the acquisition order of the k-space lines from shot to shot. Alternatively, the relaxation time weighting may be varied by variation of the echo shifting of the individual echo signals. Flip angle sweeps and/or different balancing regimes may also be used (see below).

Individual images at different echo times can thus also be reconstructed from the acquired echo signals. Hence, not only a $T_1$-map and/or a $T_2$-map and/or a $T_2^*$-map can advantageously be derived from the acquired echo signals, but also a $B_0$ map and/or a water map and/or a fat map and/or a susceptibility-map may be reconstructed according to the known Dixon scheme. These may subsequently be used to provide distortion-free MR images by also taking the $B_0$ map into account. MR images can be synthesized with a desired water/fat/iron appearance.

The acquired echo signal data attributed to a particular relaxation time will generally be undersampled, at least in the periphery of k-space. Hence, compressed sensing (CS) may advantageously be used for reconstruction of the MR image and/or for derivation of the respective relaxation time map from the undersampled signal data. The (KWIC-filtered) k-space profiles attributed to a particular relaxation time weighting may even be distributed irregularly in k-space. The theory of CS is known to have a great potential for significant signal data reduction. In CS theory, a signal data set which has a sparse representation in a transform domain can be recovered from undersampled measurements by application of a suitable regularization algorithm. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction.

Reduction of the amount of data acquired is also achieved by, wherein the using a parallel image reconstruction algorithm to reconstruct at least one MR image. The parallel imaging algorithm may be combined with compressed sensing to further reduces the amount of data acquired.

Moreover, pure proton density (PD) and/or $T_2$ and/or $T_1$ contrast-weighted MR images can be produced from a single stack-of-stars or stack-of-spirals acquisition according to the invention (see Neumann et al., Magn. Reson. Med., 1680-1686). Also an MR image with 'mixed' (PD, $T_2$, $T_1$) contrast can be synthesized from the signal data of a single acquisition.

To further optimize the k-space distribution of echo signals having different contrasts in the center of k-space during the acquisition of a number of shots, the angular ordering of the radial k-space profiles may be chosen according to a Golden angle-scheme. In the Golden angle-scheme, as mentioned above, the angle of the k-space profiles is incremented each time by $\Delta\Phi=111.25°$ from acquisition to acquisition, which corresponds to 180° multiplied by the Golden ratio. Therefore, subsequently sampled radial k-space profiles always add complementary information while filling the largest gaps within the previously sampled set of profiles. As a consequence, any sequential set of acquired profiles covers k-space approximately uniformly.

According to the invention, echo signals from different k-space slices are acquired in each shot of the imaging sequence. Preferably, k-space profiles are acquired from at least two different slices at the same angular position before acquiring further k-space profiles at a different angular position. In other words, phase-encoding steps along the slice direction are acquired sequentially in each shot before k-space profiles at different (Golden angle) positions are acquired. This ensures that periods of Cartesian sampling (in the slice direction) are kept short, which leads to high data consistency within the stack of slices and preserves the general motion-robustness of the stack-of-stars scheme.

In a further preferred embodiment of the invention, the imaging sequence involves a flip angle sweep of the RF pulses, wherein the flip angle attributed to each acquired echo signal is taken into account in the image reconstruction. The relaxation weighting of a k-space profile can be influenced by the flip angle sweep as typically used in TSE acquisitions. The information about the flip angle sweep needs to be incorporated, e.g. via a corresponding model, in the estimation of the relaxation time weighting. Furthermore, the flip angle sweep can be also adjusted to improve the precision of the estimation of the relaxation weighting. For example, in case the total number of k-space profiles is small, the number of relaxation time weightings during a TSE shot can be reduced using the flip angle sweep.

The method of the invention may also comprise the step of estimating and correcting motion-induced displacements and phase errors in the acquired signal data. For example, low-resolution MR images reconstructed from the central k-space data of individual shots may be compared to each other to compensate for displacements and phase errors that are caused by patient motion. These factors should be corrected for in the k-space data in accordance with the invention prior to further processing. This renders the method of the invention robust with respect to motion of the examined object during signal acquisition. Since the variation of the relaxation time weighting according to the invention also modifies the contrast of each reconstructed low resolution MR image, extra measures may be necessary for an exact determination and correction of object motion. Similarity measure methods such as cross correlation and normalized mutual information may be used to align the obtained multi-contrast low resolution images.

According to yet another preferred embodiment, the radial density of the k-space profiles may be varied as a function of the slice position in k-space, wherein the radial density is higher at more central k-space positions and lower at more peripheral k-space positions. In this embodiment, the radial k-space sampling density (i.e. the number of differently oriented radial k-space profiles per slice) is varied from slice to slice. The radial density of the k-space profiles is higher in slices that are located closer to the k-space center ($k_z=0$), while the radial density of the k-space profiles is lower in slices that are located more remotely from the k-space center. This approach minimizes the overall scan time while providing oversampling (i.e. a higher radial sampling density than required by the Nyquist criterion) in the image energy-dominating central k-space. This supports the application of the KWIC filtering technique according to the invention. The radial sampling density may gradually decrease to the lower radial sampling density in the peripheral k-space regions. In the peripheral regions, the radial k-space sampling density may even be below the Nyquist threshold without a significant impact on image quality.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

FIG. 2 schematically illustrates the stack-of-stars acquisition scheme of the invention;

FIG. 3 schematically illustrates a further embodiment of the stack-of-stars acquisition scheme of the invention;

FIG. 4 illustrates the procedure of contrast determination according to the invention as a block diagram.

DETAILED DESCRIPTION OF THE EMBODIMENTS

Figure 1:
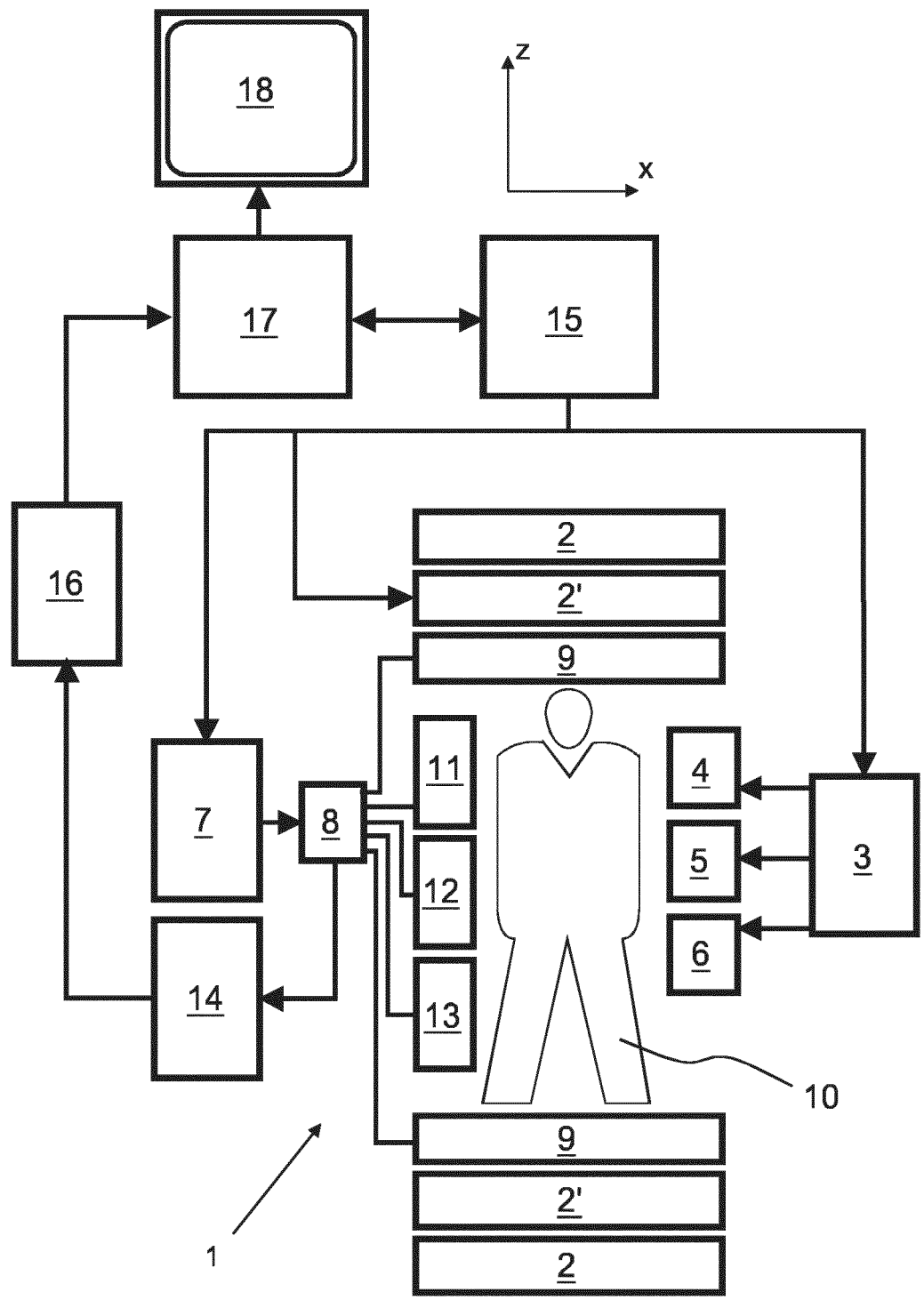
FIG. 1 shows a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 is programmed to execute the method of the invention described herein above and in the following.

FIG. 2 illustrates the k-space sampling of stack-of-stars imaging according to the invention, wherein echo signals are acquired using a TSE imaging sequence. In each of a number of shots comprising a spatially non-selective or slab-selective RF excitation, a train of echo signals is acquired wherein each echo signal represents a k-space profile. The echo signals are acquired as radial k-space profiles from a number (seven in the embodiment of FIG. 2a) of parallel k-space slices 21, 22, 23, 24, 25, 26, 27. The slices are arranged at different positions along slice direction $k_z$. In the $k_z$-direction Cartesian phase-encoding is performed, while the echo signals are acquired within each single slice along radial 'spokes' S1, S2, S3, S4, S5, S6, S7, S8 that are rotated around the center ($k_x=k_y=0$). This results in a cylindrical k-space coverage composed of stacked discs. In the depicted embodiment, phase-encoding steps along the slice direction $k_z$ are acquired sequentially before k-space profiles at different angular positions are acquired. For the angular ordering of the spokes S1-S8 the above-described Golden angle-scheme is employed. The angle of the spokes is incremented each time by $\Delta\Phi=111.25°$. The different shots are indicated by the arrows pointing in the negative $k_z$-direction. Successive acquisition of the phase-encoding steps along the slice direction is performed before sampling k-space profiles at different Golden angular positions which is essential to ensure high data consistency and general motion-robustness. The invention suggests a variation of the TSE contrast or TSE order during acquisition of the k-space spokes S1-S8. The variation of the TSE contrast can be achieved, e.g., by TSE echo shifting as it is commonly used in asymmetric TSE techniques. The variation of the TSE contrast or TSE order achieves the acquisition of a collection of different TSE contrasts in each k-space slice 21-27. Individually relaxation time-weighted MR images can be reconstructed, e.g., by the use of iterative SENSE, CS in combination with KWIC filtering. The KWIC technique selects the sections of only those k-space spokes S1-S8 having the desired $T_2$ weighting from the central k-space region which contains the crucial information regarding image contrast. By this filtering of the k-space data, the reconstruction of an MR image having the desired relaxation time contrast is enabled. Contaminations from unwanted relaxation time weightings are restricted to the peripheral k-space regions and are thus strongly reduced in the final MR image. The reconstruction of the individual contrasts can be used to estimate the relaxation decay ($T_2$) and to derive a corresponding $T_2$ map. A $T_2$ map can be obtained, for example, by pixel-wise determination of the signal decay in the differently $T_2$-weighted MR images. The TSE data can then be 'deblurred' using the estimated relaxation decay. Pure PD- and $T_2$-weighted MR images can be reconstructed from the single stack-of-stars acquisition. Also mixed contrasts ($T_2$, PD) based on user preference can be synthesized.

In the embodiment illustrated in FIG. 3, k-space sampling is also performed according to a stack-of-stars scheme. The downwards oriented arrows indicate subsequent shots A, B, C, D of the used multi-echo imaging sequence. The radial k-space profiles are acquired from five parallel k-space slices 21-25. Phase-encoding steps along the slice direction $k_z$ are acquired sequentially before k-space profiles at different angular positions are acquired. The variation of the TSE contrast per k-space slice is achieved in this embodiment by starting the acquisition in a different slice in each shot. Shot A starts acquisition in slice 21, then proceeds sequentially through slices 22-25 and finally, with the last echo of shot A, a further k-space spoke at a different angular position is acquired from slice 21. Shot B then starts in slice 22 and cyclically acquires slices 23-25 and 21-23. The scheme is perpetuated through further shots C and D. This variation of the TSE contrast achieves the acquisition of a collection of different TSE contrasts in each k-space slice 21-25 such that individually relaxation time-weighted MR images can be reconstructed.

FIG. 4 schematically illustrates the method of the invention. After the acquisition of the full k-space data in a number of shots of the imaging sequence with the different relaxation time weightings in step 31, motion is estimated and corrected for in step 32 by reconstruction of low-resolution images from the single shot data using appropriate similarity measures. Then individual MR images 33a-e with correspondingly different contrasts are reconstructed and the obtained contrast weightings are fitted to a contrast model in step 34 to estimate the relaxation weighting of the acquired signals. The acquired echo signals are then compensated according to the contrast model in step 35 in order to reduce blurring artifacts in the final MR images. Pure contrast images (e.g. a $T_2$-weighted MR image and a proton density-weighted MR image) are then reconstructed from the compensated MR signal data in step 39. A contrast map ($T_2$ map) is obtained additionally in step 36 as a result of the fitting procedure. A user preference regarding the desired contrast is entered in step 37. On this basis, MR images with a correspondingly synthesized combined contrast are reconstructed from the echo signals in step 38.

The invention claimed is:

1. A method of magnetic resonance (MR) imaging of an object positioned in an examination volume of a MR device, the method comprising:
   a) generating MR signals by subjecting the object to a number of shots of a multi-echo imaging sequence comprising RF pulses and switched magnetic field gradients, wherein a train of echo signals is generated by each shot;
   b) acquiring the echo signals according to a stack-of-stars or stack-of-spirals scheme, wherein the echo signals are acquired as radial or spiral k-space profiles arranged at different positions along a slice direction in k-space, wherein echo signals from different k-space slices are acquired in each shot of the imaging sequence, starting the acquisition in a different slice in each shot, wherein relaxation time weightings of the echo signals are varied during the acquisition of a full signal data set such that the echo signals attributed to each given k-space slice are acquired with different relaxation time weightings and the echo signals are acquired from each k-space slice with different relaxation time weightings; and
   c) reconstructing at least one MR image of a desired contrast from the acquired echo signals using a k-space weighted image contrast (KWIC) filter.

2. The method of claim 1, wherein relaxation time maps are derived from the acquired echo signals, wherein the acquired echo signals are compensated for variations according to the derived relaxation time maps.

3. The method of claim 1, wherein the imaging sequence is a turbo spin echo (TSE) sequence or a turbo field echo (TFE) or a balanced (turbo) field echo sequence or an echo planar imaging (EPI) sequence or a GRASE sequence.

4. The method of claim 1, wherein the relaxation time weighting is varied by variation of an acquisition order of the k-space profiles in the slice direction from shot to shot.

5. The method of claim 1, wherein the relaxation time weighting is varied by variation of an echo shifting of the echo signals.

6. The method of claim 5, wherein a Dixon reconstruction algorithm is used to separate contributions from water and fat to the acquired echo signals.

7. The method of claim 1, wherein a $T_1$-map and/or a $T_2$-map and/or a $T_2^*$-map and/or a $B_0$ map and/or a water map and/or a fat map and/or susceptibility map are derived from the acquired echo signals.

8. The method of claim 1 wherein at least a $T_2$-weighted MR image and/or at least a $T_1$-weighted MR image and/or at least a proton density-weighted MR image are reconstructed from the acquired echo signals.

9. The method of claim 1, wherein at least an MR image having a combined $T_2$-weighted, proton density-weighted and/or $T_1$-weighted contrast is synthesized from the acquired echo signals.

10. The method of claim 1, wherein the MR imaging sequence involves a flip angle sweep of the RF pulses, wherein the flip angle attributed to each acquired echo signal is taken into account in the reconstruction of the at least one MR image.

11. The method of claim 1, wherein low-resolution MR images reconstructed from echo signals acquired from central k-space are compared to each other to compensate for displacements and phase errors that are caused by patient motion.

12. The method of claim 11, wherein a similarity measure method is used to align the low resolution MR images.

13. The method of claim 12, wherein the similarity measure method is selected from a group consisting of at least one of: cross correlation and normalized mutual information.

14. The method of claim 1, wherein radial density of the k-space profiles is varied as a function of the slice position in k-space, wherein the radial density is higher at more central k-space positions and lower at more peripheral k-space positions.

15. A magnetic resonance (MR) device comprising: at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is configured to:

a) generate MR signals by subjecting the object to a number of shots of a multi-echo imaging sequence comprising RF pulses and switched magnetic field gradients, wherein a train of echo signals is generated by each shot;
b) acquire the echo signals according to a stack-of-stars or stack-of-spirals scheme, wherein the echo signals are acquired as radial or spiral k-space profiles arranged at different positions along a slice direction in k-space, wherein echo signals from different k-space slices are acquired in each shot of the imaging sequence, starting the acquisition in a different slice in each shot wherein relaxation time weightings of the echo signals are varied during acquisition of a full signal data set such that the echo signals attributed to each given k-space slice are acquired with different relaxation time weightings and the echo signals are acquired from each k-space slice with different relaxation time weightings; and
c) reconstruct at least one MR image of a desired contrast from the acquired echo signals using a k-space weighted image contrast (KWIC) filter.

16. A non-transitory computer readable storage medium comprising instructions stored therein for causing a processor to execute a method, the method comprising:
a) generate a number of shots of a multi-echo imaging sequence comprising RF pulses and switched magnetic field gradients;
b) acquire the echo signals according to a stack-of-stars or stack-of-spirals scheme, wherein the echo signals are acquired as radial or spiral k-space profiles arranged at different positions along a slice direction in k-space, wherein echo signals from different k-space slices are acquired in each shot of the imaging sequence, starting the acquisition in a different slice in each shot and wherein the echo signals are acquired from each k-space slice with different relaxation time weightings; and
c) reconstruct at least one MR image of a desired contrast from the acquired echo signals using a k-space weighted image contrast (KWIC) filter.

* * * * *